United States Patent [19]

Sampson et al.

[11] Patent Number: 4,503,611
[45] Date of Patent: Mar. 12, 1985

[54] METHOD OF MAKING A CIRCUIT ASSEMBLY

[75] Inventors: Stephen A. Sampson; Thor F. Olson, both of Wheaton, Ill.

[73] Assignee: Molex Incorporated, Lisle, Ill.

[21] Appl. No.: 526,519

[22] Filed: Aug. 26, 1983

Related U.S. Application Data

[63] Continuation of Ser. No. 303,347, Sep. 18, 1981, abandoned.

[51] Int. Cl.³ .............................................. H01R 4/00
[52] U.S. Cl. ..................................... 29/845; 339/17 F
[58] Field of Search ................. 29/845, 842, 827, 844; 339/99 R, 17 F

[56] References Cited

U.S. PATENT DOCUMENTS

| | | | |
|---|---|---|---|
| 3,444,506 | 5/1969 | Wedekind . | |
| 3,562,798 | 2/1971 | Bragg, Jr. . | |
| 3,858,159 | 12/1974 | Worth . | |
| 3,924,325 | 12/1975 | Kufner | 29/842 |
| 3,938,245 | 2/1976 | Lovendusky et al. | 29/842 |
| 4,012,093 | 3/1977 | Crane | 339/17 F |
| 4,125,310 | 11/1978 | Reardon | 339/176 MF X |

FOREIGN PATENT DOCUMENTS

| | | | |
|---|---|---|---|
| 11923 | 6/1980 | Fed. Rep. of Germany | 339/99 R |
| 44-21624 | 9/1969 | Japan | 29/842 |
| 25284 | 2/1977 | Japan | 29/845 |
| 1177831 | 1/1970 | United Kingdom | 29/845 |

OTHER PUBLICATIONS

IBM Tech Disclosure Bulletin vol. 9, No. 10, Mar. 1967, p. 1283, by D. O. Johnson, Jr.

*Primary Examiner*—Mark Rosenbaum
*Assistant Examiner*—Carl J. Arbes
*Attorney, Agent, or Firm*—Louis A. Hecht

[57] ABSTRACT

A circuit assembly and method of making the same involves locating a flat flexible circuit member with an electrically conducting region defined thereon between a pair of opposed, relatively rigid wafers with a pin conductor inserted through the member and the wafers. Each wafer includes an aperture extending through the wafer, the aperture of one wafer aligned with the aperture of the other wafer and arranged to abut with the conducting region at the point of desired termination. The pin conductor is forced into and is retained within each aperture in each wafer, piercing the conducting region on the flat flexible circuit member in the process and making electrical contact with the conducting region. A portion of the pin conductor extends outwardly of one of the wafers for electrical connection to a female connector.

2 Claims, 6 Drawing Figures

METHOD OF MAKING A CIRCUIT ASSEMBLY

This is a continuation of application Ser. No. 303,347, filed Sept. 18, 1981, abandoned.

BACKGROUND OF THE INVENTION

1. Field of the Invention

This invention relates generally to apparatus and methods for terminating a flat flexible circuit member with a pin conductor.

2. Brief Description of the Prior Art

Due to their low cost, flat flexible circuit members wherein a pattern of conducting regions are defined by coating or the like on a flexible plastic film have gained widespread acceptance. While the flat flexible circuit members have many advantages, some difficulty is experienced in terminating such members because of their flexibility.

In the past flat, flexible circuit members have been terminated in one of two ways. In one method, known as the insulation displacement method, the circuit member is pierced with a sharp portion of a terminal and the terminal is then either crimped or clinched against the circuit member. In the other method, prepunched holes are formed in the circuit member and a pin conductor or the like is then inserted through the holes. The insulation displacement method is less than optimal since the displacement of the insulation may be incomplete, interferring with the electrical connection between the conducting region on the circuit member and the terminal itself. In addition, the flexibility of the circuit member makes it difficult to crimp or clinch the sharp portion of the terminal to the circuit member. The method involving prepunching of holes in the circuit member is disadvantageous since a requirement of prepunched holes adds additional cost to the production of the circuit member.

SUMMARY OF THE INVENTION

It is, therefore, the principle object of the present invention to provide a circuit assembly and method of making the same in which a flat flexible circuit member is terminated with a pin conductor in a manner which is efficient and inexpensive and overcomes many of the disadvantages experienced in the prior art.

In one form of the invention currently contemplated, the circuit assembly for terminating a flat flexible circuit member with a pin conductor includes a flat flexible circuit member with an electrically conducting region defined thereon. At least one pin conductor is insertable through the electrically conducting region, with the conductor in electrical connection with the conducting region on the circuit member. A pair of relatively rigid insulating wafers are positionable in opposed relationship on opposite sides of the circuit member, and each includes an aperture alignable with the aperture of the other wafer. The apertures of each wafer are abuttable with the conducting region on the circuit member. The pin conductor is extendable through the conducting region and retainable partially within the apertures in the wafers with a portion of the pin conductor extending outwardly of at least one of the wafers.

In accordance with the invention currently contemplated, a method of making a circuit assembly including a flat flexible circuit member with a conducting region defined thereon includes the step of arranging a pair of relatively rigid wafers in opposed relationship on opposite sides of a flexible circuit member. An aperture in each wafer is aligned with the aperture of the other wafer and with a conducting region defined on the member. A pin conductor is forced through the aligned apertures and the conducting region. The conductor is then secured within each of the apertures with the conductor in electrical contact with the conducting region and extending outwardly of one of the wafers.

DESCRIPTION OF THE PREFERRED EMBODIMENT

Figure 1:
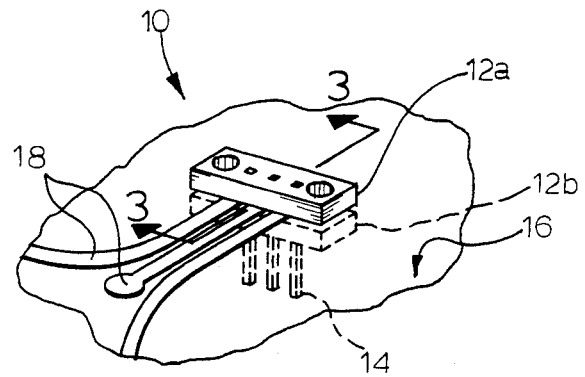
FIG. 1 is a partial perspective view of one embodiment the circuit assembly of the present invention.

Turning now to the figures, FIG. 1 illustrates a circuit assembly, generally designated 10, of the present invention including a pair of opposed relatively rigid electrically insulating wafers 12, a plurality of pin conductors 14 and a flat flexible circuit member 16 with a plurality of conducting regions 18 defined thereon. The wafers 12 are arranged in opposed relationship on opposite sides of the circuit member 16 with the pin conductors 14 extending through the wafers 12 and the circuit member 16 so as to secure the entire assembly 10 together in a stable mounting.

Each wafer 12 is conveniently formed of a nonconducting material such as plastic or the like, preferably of sufficient thickness to have greater rigidity than that possessed by the flexible circuit member 16. In the preferred embodiment wafers 12 are sufficiently stiff to resist manual flexing. As used herein the term "relatively rigid wafers" means only that the wafers are less flexible than the flexible circuit member 16 resulting in a composite assembly 10 of greater stability. The wafers 12 are identical, with a pair of alignment apertures 20 arranged on opposite ends of the conveniently rectangular wafer 12 and a plurality of pin conductor receiving apertures 22 arranged in a line between the alignment apertures 20. The member 16 is also provided with a pair of alignment apertures 20A, similar in size and spacing with apertures 20 provided in the wafers 12 and located to either side of the intended point of termination. For example, each wafer 12 may conveniently be made of a plastic such as polypropylene molded in the form of a rectangular block approximately 2.5 centimeters in length, 0.6 centimeters in width and 0.3 centimeters thick, the apertures 20 and 22 being formed during the molding process. The configuration of the apertures 22 corresponds with the cross-sectional shape of the pin conductors 14, and in the illustrated embodiment with pin conductors 14 of a square cross-sectional configuration, the apertures 22 are also conveniently square.

Figure 3:
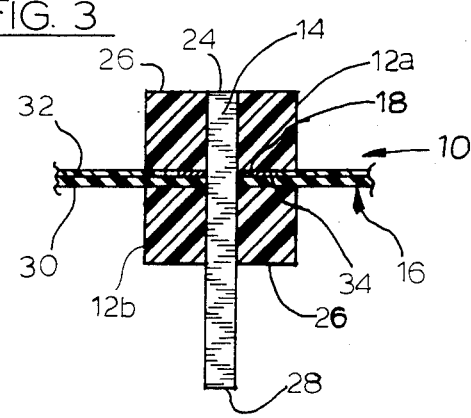
FIG. 3 is an enlarged cross-sectional view taken generally along the line 3—3 in FIG. 1.

As shown in FIG. 3, one end 24 of each pin conductor 14 is flush with the outwardly facing surface 26 of the upper wafer 12a while the other end 28 of each pin conductor 14 extends outwardly beyond the outwardly facing surface 26 of the other wafer 12b. The outward extension of the end 28 is governed by the specific application intended, it being necessary only that the outward extension be sufficient to enable connection of the conductor 14 to an appropriate female conductor of conventional design (not shown).

In one conventional form of the flat circuit member 16, the conducting regions 18, defined on an upper surface of a base film 30, are covered by a thin insulating film 32, such as mylar or the like. In accordance with one embodiment of present invention, the region immediately surrounding the point of intended termination of the conducting region 18 with the pin conductor 14 is maintained free of the insulating film 32, creating a gap 34, shown in FIG. 3.

Preferably, the pin conductor receiving apertures 22 are made of sufficiently small size to frictionally secure the pin conductors 14 within them. This can be accomplished by producing a very close tolerance between the inside size of the apertures 22 and the outside shape of the pin conductors 14 such that sufficient friction is generated upon insertion to retain the conductors 14 within the apertures 22. Alternatively, the wafers 12 may be made of somewhat resilient material such as hard rubber, resilient plastic or the like such that the conductors 14 are resiliently gripped by the wafers 12 as they force the wafer 12 material outwardly upon penetration.

Figure 2:
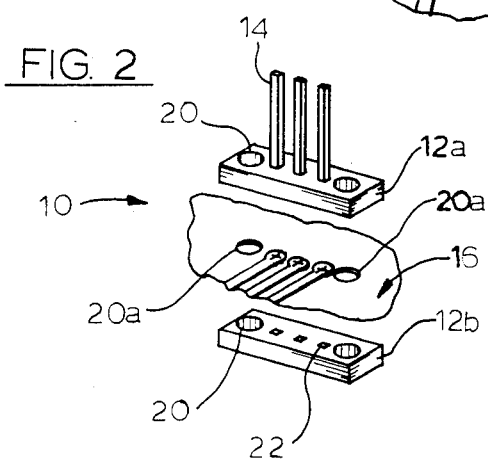
FIG. 2 is an exploded view of the circuit assembly shown in FIG. 1.

The method of making the circuit assembly 10, illustrated in FIGS. 2 and 4A through 4C involves positioning the wafers 12a and 12b on opposite sides of the flat flexible circuit member 16. The pin conductor receiving apertures 22 of one wafer 12 are aligned with those of the opposite wafer 12, each adjacent and preferably in abutting relationship with the location on the conducting region 18 to be terminated. The alignment apertures 20 of each wafer 12 and the apertures 20A of the member 16 are also aligned with each other. In accordance with one preferred embodiment of the present invention, the pin conductors 14 are preloaded into the wafer 12a, as shown in FIG. 2, so that the conductors 14 initially extend out of the outwardly facing surfaces 26 away from the member 16.

Figure 4A:
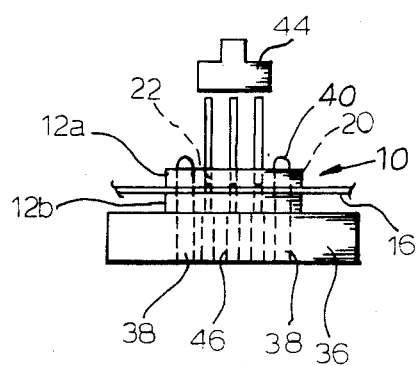
FIGS. 4A through 4C are fragmentary front elevational views illustrating the method of forming the circuit assembly shown in FIG. 1.
Figure 4B:
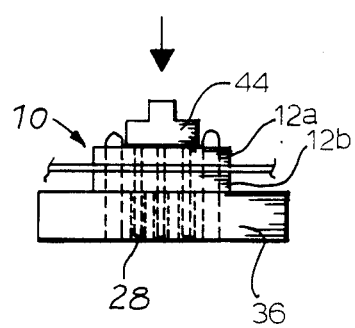

As shown in FIG. 4A, a preferred method for aligning the apertures 22 with each other and with the desired location for termination utilizes a plate 36 with a pair of upwardly extending, spaced posts 38. Since the spacing between the posts 38 coincides with that between the apertures 20, the conveniently curved free ends 40 of each post 38 are telescoped through the apertures 20 of the wafer 12b and the flat flexible circuit member 16. In this way the apertures 22 of the wafer 12b are accurately aligned with the desired location of the point of termination on the circuit member 16. The other wafer 12a is then positioned on the plate 36 with the posts 38 extending through its alignment apertures 20 as well.

In an embodiment in which the pin conductors 14 are preloaded into the wafer 12a, the wafer 12a is positioned atop the circuit member 16 with the pin conductors 14 extending outwardly away from the member 16. If desired, the pin conductors 14 are not preloaded into the wafer 12a but are machine fed into the wafers 12 in one operation after the wafers 12 are located in alignment.

In the illustrated embodiment using a preloaded wafer, press 44 is initially located over the free ends 24 of the pin conductors 14 now extending upwardly away from the upper wafer 12a. The press 44 is operated to move toward the assembly 10, as indicated by the arrow in FIG. 4B, causing the pin conductors 14 to push through the circuit member 16, forming apertures at the desired location in the conducting region 18 as the conductors 14 pass through the member 16 and into the wafer 12b and establishing electrical connection between the intermediate portion of the pin conductors 24, and the conducting region 18 of the circuit member 16. The downward motion of the press 44 is continued until the pin conductors 14, force fitted into the apertures 22, are in the position, shown in FIG. 4B, with the ends 24 of the pin conductors 14 flush with the upper surface of the wafer 12a and the ends 28 extending downwardly from the outwardly facing surface 26 of the wafer 12b. Apertures 46 are provided in the plate 36 to receive the ends 28 of the conductors 14 as they are pressed through the lower wafer 12b. Preferably the apertures 46 are larger than the apertures 22 so that the conductors 14 freely slide through the apertures 46, the apertures 46 merely providing clearance for movement of the conductors 14.

Figure 4C:
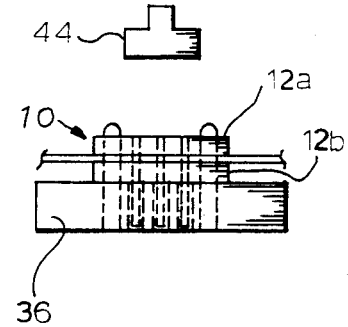

The press 44 is thereafter withdrawn, as shown in FIG. 4C, and the completed circuit assembly 10 may be lifted from the plate 36. The resulting circuit assembly 10 is sturdy and may easily be connected to a conventional female connector (not shown). Thus, despite the flexible nature of the circuit member 16, a stable mechanical base is formed for subsequent connection to other components. If desired, a plurality of assemblies 10 may be formed on one member 16 in the same operation.

We claim:

1. A method of making a plug-type connector assembly including a flat, flexible circuit member having a flat insulative substrate and at least one flat conductor defined on a surface thereof, and first and second relatively rigid wafers made from an electrically nonconductive material with each of said wafers having at least one aperture extending therethrough adapted to receive generally elongated metallic pin conductor, said method comprising the steps of:
   forcing the pin conductor through the aperture of the first wafer until one end of the pin conductor is flush with a surface of said first wafer,
   arranging said wafers in opposed relationship on opposite sides of the flexible circuit member, so that the aperture in each of said wafers is aligned with the aperture of the other wafer and with the flat conductor defined on the circuit member, and
   forcing said pin conductor through said circuit member flat conductor and into the aligned aperture of the second wafer thereby forming an aperture in said circuit member flat conductor to establish electrical connection between the flat conductor of the circuit member and an intermediate portion of said pin conductor, with a portion of said pin conductor frictionally secured and force fitted within said apertures within said wafers and the other end of said pin conductor extending outwardly from said second wafer, and to secure the wafers and flexible circuit member together in a stable mounting.

2. A method of making a plug-type electrical connector assembly including a flat, flexible circuit member having a flat insulative substrate and at least one flat conductor defined on a surface thereof, and first and second relatively rigid wafers made from an electrically nonconductive material with each of said wafers having at least one aperture extending therethrough adapted to receive generally elongated metallic pin conductor to form a termination therewith, said method comprising the steps of:

covering said circuit member conductor with an insulating film and maintaining the region surrounding the point of intended termination with said pin conductor free of said film, forcing the pin conductor at least partially through the aperture of the first wafer, arranging said wafers in opposed relationship on opposite sides of the flexible circuit member, so that the aperture in each of said wafers is aligned with the aperture of the other wafer and with the flat conductor defined on the circuit member, and forcing said pin conductor through said circuit member flat conductor and into the aligned aperture of the second wafer thereby forming an aperture in said circuit member flat conductor to establish electrical connection between the flat conductor of the circuit member and an intermediate portion of said pin conductor with a portion of said pin conductor frictionally secured and force fitted within said apertures within said wafers and a portion of said pin conductor extending outwardly of at least one of said wafers and to secure the wafers and flexible circuit member together in a stable mounting.

* * * * *